Figure 1:
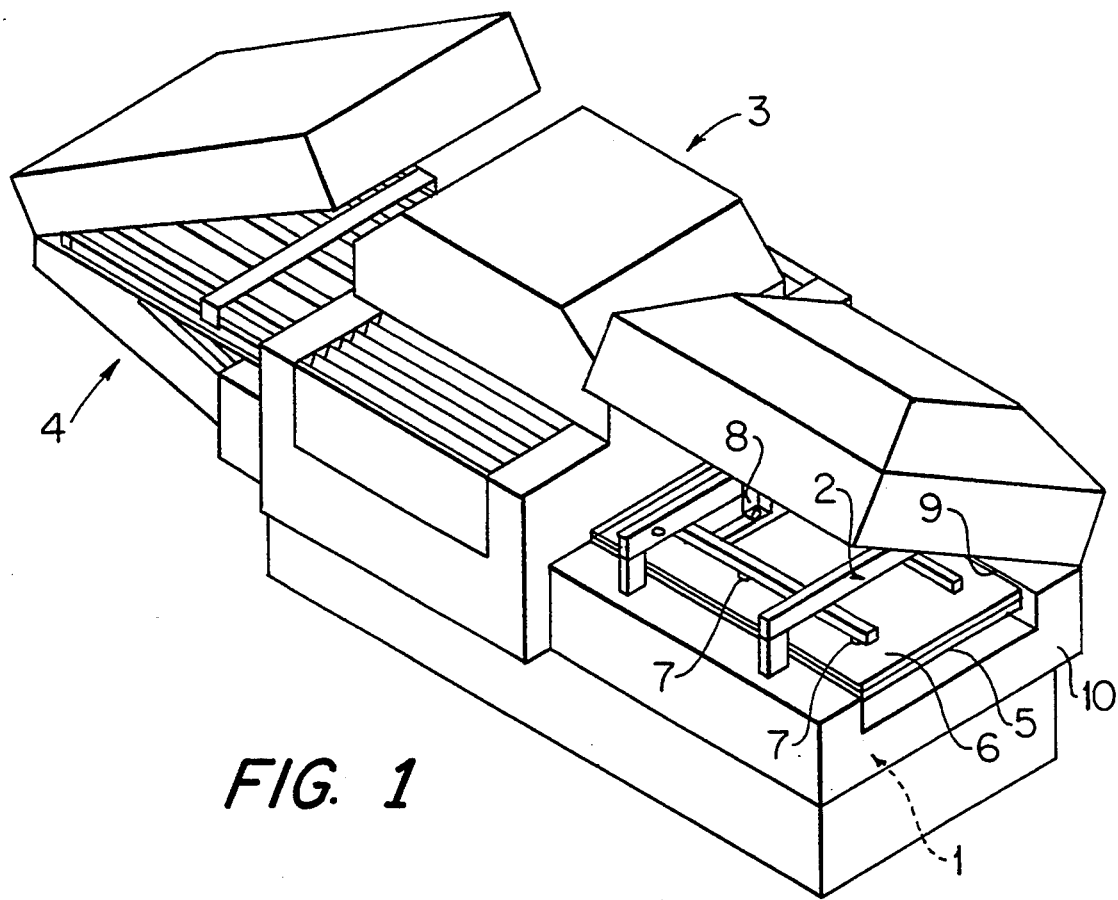

United States Patent [19]

Talts

[11] Patent Number: 5,434,646
[45] Date of Patent: Jul. 18, 1995

[54] METHOD AND APPARATUS FOR AUTOMATIZED EXPOSING OF LIGHT SENSITIVE MATERIAL BY MEANS OF LASER MEANS OF LASER LIGHT

[75] Inventor: Gustav Talts, Lidingö, Sweden

[73] Assignee: Misomex Aktiebolag, Hagersten, Sweden

[21] Appl. No.: 140,022

[22] PCT Filed: May 26, 1992

[86] PCT No.: PCT/SE92/00355
§ 371 Date: Oct. 26, 1993
§ 102(e) Date: Oct. 26, 1993

[87] PCT Pub. No.: WO92/21517
PCT Pub. Date: Dec. 10, 1992

[30] Foreign Application Priority Data

May 28, 1991 [SE] Sweden ................ 9101618

[51] Int. Cl.⁶ ............................................ G03B 27/10
[52] U.S. Cl. ................................... 355/53; 347/263
[58] Field of Search ..................... 346/1.1, 108; 355/53

[56] References Cited

U.S. PATENT DOCUMENTS

| 4,044,385 | 8/1977 | Nishimura | 358/300 |
| 4,149,798 | 4/1979 | McGowan et al. | 355/8 |
| 4,159,991 | 4/1979 | Dillow . | |
| 4,821,048 | 4/1989 | Hovnig et al. | 346/108 |
| 5,028,955 | 7/1991 | Hayashida | 355/53 |
| 5,243,377 | 9/1993 | Umatate | 355/57 |

FOREIGN PATENT DOCUMENTS

| 162469 B | 10/1991 | Denmark . |
| 20427222 | 5/1991 | European Pat. Off. . |
| 2725308 | 12/1977 | Germany . |

Primary Examiner—M. L. Gellner
Assistant Examiner—Daniel P. Malley
Attorney, Agent, or Firm—Larson and Taylor

[57] ABSTRACT

A method and an apparatus for exposing several different original images onto a light sensitive material like an offset plate or an intaglio plate by means of a laser exposure process, whereby the light sensitive plate(6), is exposed in several stages with a minor part of the light sensitive plate(6) at the time by an exposure method with three cooperating movements of the parts of the apparatus, namely a) a stepwise displacement of an exposure table (5) in a first direction (X-direction), b) a stepwise displacement of a laser unit (3) in a second direction (Y-direction) which is perpendicular to said first direction, and c) a successive displacement in said first or second direction (X or Y-direction) by a laser gun (13) while sweep exposing the light sensitive material by means of laser light beam whereby the exposure table (5) and the carrier of the laser unit (3) are in fixed positions.

9 Claims, 3 Drawing Sheets

METHOD AND APPARATUS FOR AUTOMATIZED EXPOSING OF LIGHT SENSITIVE MATERIAL BY MEANS OF LASER MEANS OF LASER LIGHT

The present invention relates to a method and an apparatus for exposing a multi-pages original images onto a light sensitive material like a light sensitive offset plate or an intaglio plate by means of a laser exposure/burning process.

In the following the expression "pages" does not only relate to pages to be printed but also a series of pictures, tables and many other images which are to be exposed separately onto a special part of a light sensitive material. It should also be noted that the above mentioned light sensitive plates are only one example, out of many other possible examples, of light sensitive materials, and that the method and the apparatus may as well be used for exposing of images onto films and onto any kinds of materials having a light sensitive layer.

Lately some print makers have started to use laser light beams for exposing light sensitive offset plates or intaglio plates. The advantages of using laser is, among other things, that it is possible

- to execute the exposure directly from computer stored information concerning text, sketches and half-tone pictures etc. without the need of using negative of positive transparent films, as has so far been necessary,
- that the size of the dots which are to create the image can, within wide limits, De determined and controlled, in particular the dot creating a half-tone picture in the print and which corresponds to the screen dot in conventional screen copying processes, and this is possible in that the laser light builds up the screen dot from a large riumber of pixies, generally between 64 and 256 pixies per screen dot,
- and that therefore the gradation of the grey scale of the laser reproduced image on the printing plate can be varied within wide limits.

Like in conventional copying processes the laser light provides an activation of the illuminated part of the printing plate so that, in the succeeding developing process, said activated printing plate parts become ink carrying if the printing plate is of the positive type, or non-ink carrying respectively if the printing plate is of the negative type.

There are to-day three main methods of laser exposing printing plates, namely exposing a plate lying on a flat bed, the so called flat bed method, exposing a plate mounted inside a cylindrical drum whereby the exposing is made from inside the curved plate, which process is called internal drum method, and exposing of a plate mounted exteriorly on a cylindrical drum, whereby the exposure is made from outside, which process is called external drum method.

Each one of said three methods is disadvantageous in some respects:

In the flat bed method the entire printing plate is exposed in one single exposure step by means of a sweeping laser light beam. Generally the laser apparatus including the so called "laser gun" is stationary, whereas the printing plate is displaceable on an exposure table in relation to the laser unit. During the exposure the laser unit emits an oscillating light beam which hits the plate while said plate is slowly moving passed the laser unit until the entire plate has been exposed. Alternatively it is possible to keep the exposure table still standing and to allow the laser unit to wander over the plate during the exposure. In this type of the flat bed copying machine the distance from the laser gun or the lens system thereof to the side edges of the printing plate is substantially longer than to the central parts of the plate. This has as an effect that the sharpness and the shape of the laser dot exposed on the printing plate varies depending on where the laser beam hits the plate, For reducing, to some extent, the problem with this variation in dot sharpness and shape the laser gungenerally is mounted.on a relative high distance above the printing plate, and-for equalizing the always existing unavoidable variations in dot sharpness and shape in this type of copying machine the laser gun generally is adjusted so that the sharpness of the laser dot is located slightly to high at the edges of the plate and slightly to low at the central parts of the plate. As a consequence an ideal dot is located somewhere between the centre and the edges of the plate. Depending on the said machine design the laser copying machine is high and clumsy, and the laser burning is relatively uneven. when comparing different parts of the printing plate. Another problem is to, as far as possible, eliminate the vibrations which unevitably appear when the copying table and the laser unit move in relation to each other;

Depending on the large height of the apparatus it is very sensitive to vibrations, and even a very little unexpected movement of the laser dot on the printing plate, for instance caused by a slight shaking of the laser gun, the dot will be unsharp on the printing plate, in particular since the laser gun normally projects between 64 and 256 pixies for creating each separate screen dot when exposing an optimum grey scale;

For a good result in this method it is necessary that the base for the printing plate, generally the base of the copying machine, is extremely even, since even a very little un-eveness in the surface makes the sharpness of the dots vary;

It may also be very difficult to move the printing plate and the laser gun with an exact speed and a uniform movement in relation to each other, and it often happens that there is a slight difference in speed and uniformity and this makes the laser dots slightly overlap each other or to be 1oacted too far from each other, and this, in turn, makes stripes appear in the ready print;

The necessary large working area for the laser gun makes it necessary to use a heavy laser gun and a large and expensive lens system, and therefore the apparatus will be remarkably expensive;

In the internal and external drum methods the printing plate is generally more safely secured in relation to the laser gun than in the flat bed method, and therefore a better copying quality is obtained than with the flat bed machines. In the internal and external drum method; there however, there are on the contrary problems in mounting of the printing plate inside and on the outer surface of the drum respectively; in some cases there also are problems in obtaining an even laser exposure all over the width of the plate, especially in the internal drum method; there are also problems in obtaining an exact fixedly mounting of the printing plate on the drum (for accurate plate register); and usually there is a restricted maximum size for the printing plate.

The object of the invention is to suggest a method and an apparatus which solves most of the above mentioned problems and disadvantages in the priorly known methods and apparatus; and to suggest a method and an apparatus which further allows a substantially fully automatized exposure of several successive printing plates of the same or varying size; in which the apparatus is substantially lower and claims for less precision and accuracy in the manufacture than the apparatus for executing the priorly known methods; in which the laser gun is mounted substantially closer to the printing plate to be exposed than in priorly known apparatus; in which the apparatus is substantially less sensitive to shakings and vibrations; and in which the apparatus is simpler and cheaper than all the above mentioned three priorly known laser copying machine types.

According to the invention said objects are fulfilled in that the printing plate is exposed in several stages, with only a minor part of the plate at the time, for instance with two or four pages at the time of the usually 16, 32 or 64 pages large printing plate, and this is made by an automatized handling comprising catching an un-exposed light sensitive plate, exposing said plate by the action of three different but cooperating movements, namely a) a stepwise displacement of a plate table in a certain direction, the X-direction, b) a stepwise displacement of the laser unit in an Y-direction and c) a successive movement of a special part of the laser unit in the X-direction or the Y-direction during the oscillatory sweep exposure, which movement alternatively can be in the X-direction or the Y-direction, and finally an expelling of the exposed printing plate from the copying apparatus for subsequent developing and handling.

The method also makes it possible to make use of two or more small laser units parallelly to each other.

It should be emphasized that the designation "light sensitive plate" or "printing plate" is meant to include not only offset and intaglio printing plates but also any other possible types of light sensitive material like light sensitive films (negative and positive).

Further characteristics of, and advantages with, the invention will be evident from the following cieralied specification in which reference will be made to the accompanying drawings, which illustrate an embodiment of an apparatus according to the invention.

Figure 2:
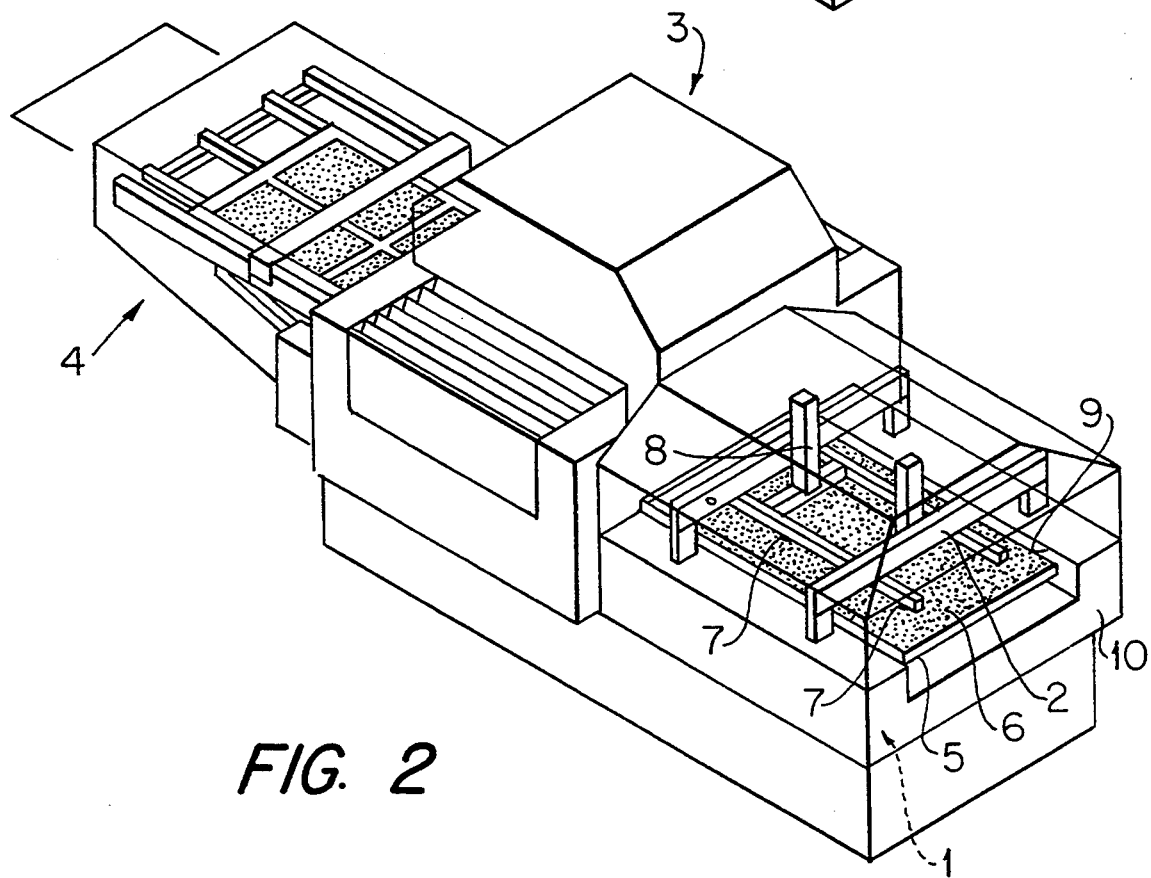
Figure 3:
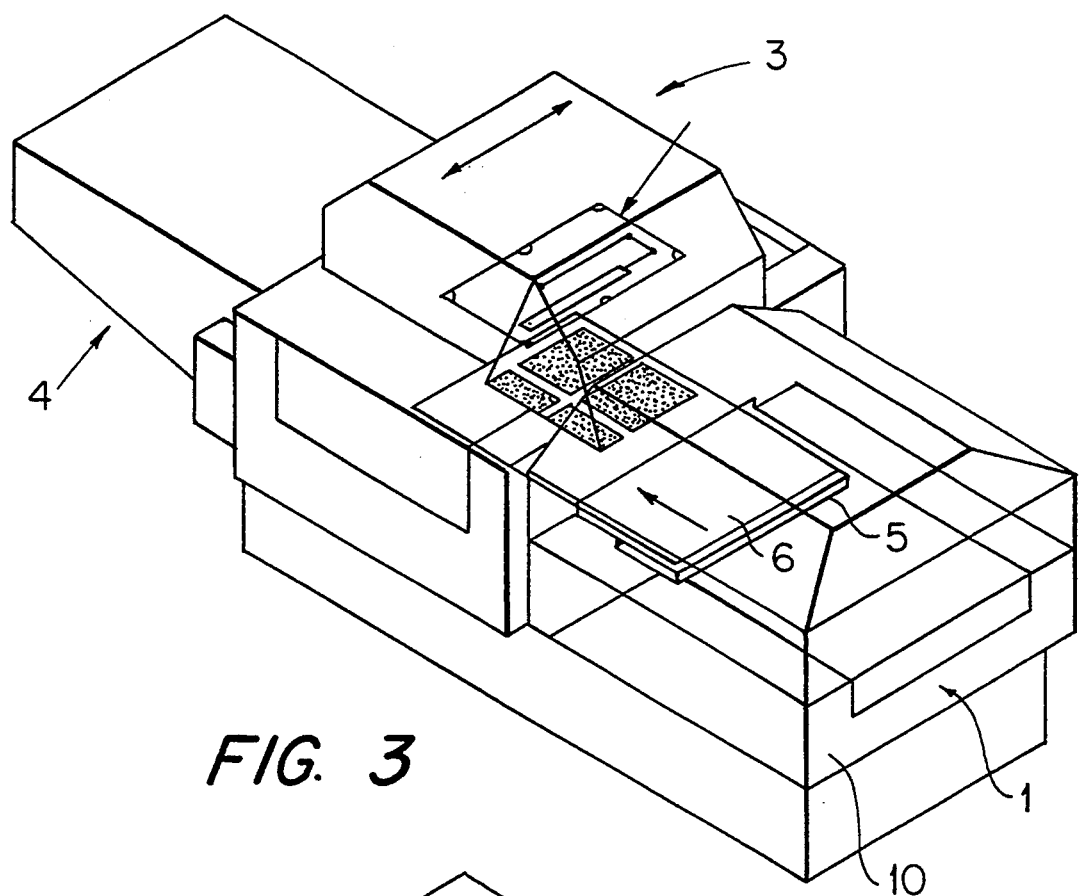
Figure 4:
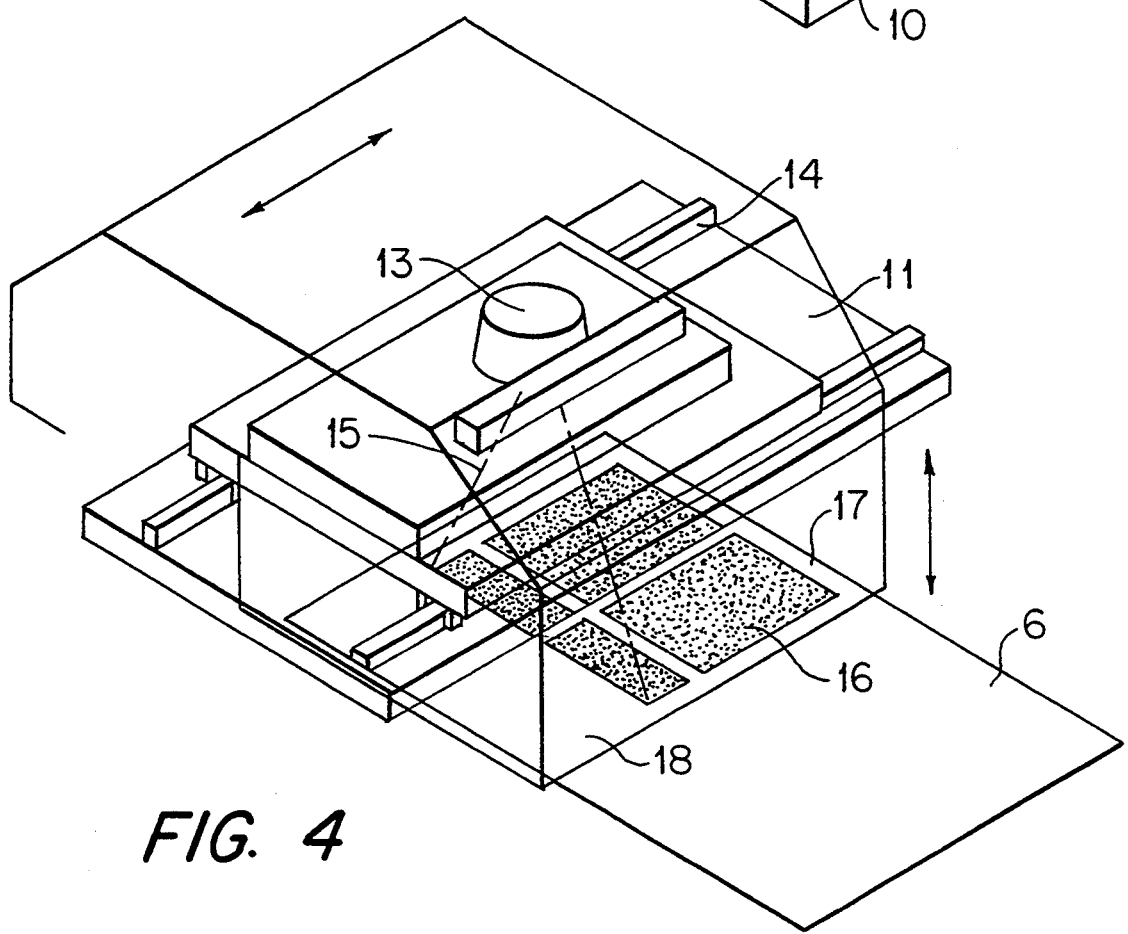

In the drawings FIG. 1 diagrammatically shows a copying plant according to the invention having, for the sake of clearness the protection housings for the plate magazine and the plate expeller partly opened. FIG. 2 is an partial cut away sketch of the same plant as in FIG. 1 showing more in detail the plate feeder and the plate expeller. FIG. 3 is a similar picture illustrating the threefold moving operation. FIG. 4 is an enlarged picture of a part of the equipment of FIG. 3, and FIG. 5, finally, is an exploded view which more in detail shows the step copying function in the apparatus according to the invention.

The basic structure.of the copying machine shown in the drawings is of the known type which is manufactured by the Swedish corporation Misomex Aktiebolag and which is marketed under the name "Step And Repeat" machine and which comprises five main parts, namely a plate cassette 1, a plate loading lift 2, a laser unit 3, a discharge conveyer 4 and a movable exposure table 5.

The plate loading lift 2, the laser unit 3 and the discharge conveyer 4 are formed as a continuous path which is serviced by the movable exposure table 5. At one end the. exposure table 5 is arranged to receive an un-exposed light sensitive plate 6, which is collected by the plate loading lift 2, and at the other end the exposure table 5 puts the exposed plate 6 down on the discharge conveyer 4, which feeds the plate directly into a (not shown) developing unit which is directly connected to the copying machine.

The plate cassette 1, which is only diagrammatically indicated in the drawings, is mounted underneath the plate loading lift 2, and it is designed for receiving such a large number of plates or other light sensitive means which correspond to an entire working period, for instance 50-75 plates, so that the machine can operate fully automated for an entire working period. The plates in the plate cassette preferably are formed with punched register bores which fit register pins of the exposure table, so that any and all successively collected plates are placed in a very accurately predetermined position on the exposure table and are exposed by the laser unit over a very exatly determined area of the plate.

Alternatively register bores may be punched in the plate after the plate is placed on the exposure table. In such case the register becomes exact in relation to the exposed portions of the plate.

The plate loading lift 2 comprises a system of tubes having suction cups 7, and it is arranged for being lowered to the plate cassette 1 by means of hydraulic or pneumatic cylinders 8 for seizing the uppermost plate 6 in the casette 1, for being lifted together with the plate and for being lowered thereby depositing the the plate on the exposure table 5. The machine is programmed so that the exposure table 5 is loacted in its end position far from the plate loading lift when a new plate 6 is being picked up.

The movable exposure table 5 on which the plate 6 is laid down is movable along a straight path 8 of the machine base 10, which path can be referred to as the X-direction, between an end position far to the right in the drawings, in which position the plate 6 is laid down on the table, an intermediate position underneath the laser unit 3, in which position the plate 6 is exposed, and an end position far to the left in the drawings, in which position the plate 6 is put down on the discharge conveyor 4 for subsequent transportation to a developing machine.

Figure 5:
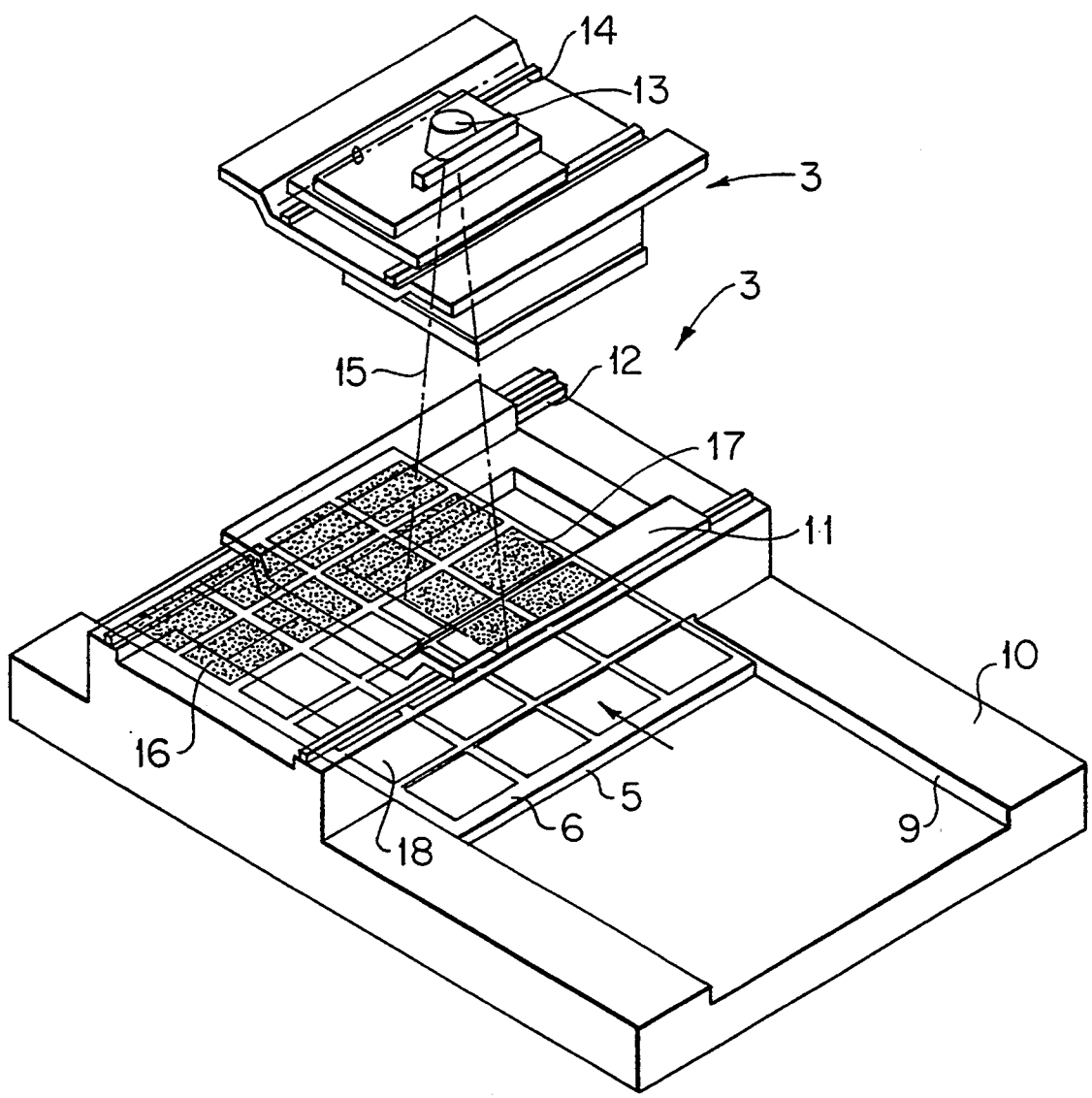

The laser unit 3 is mounted on a carriage 11 which is movable in a direction, which can be referred to as the Y-direction and which is perpendicular to the above mentioned X-direction of the exposure table 5. The laser carriage rolls on a path 12 which is integral with the machine base 10. The laser carriage 11, in turn, carries the actual laser gun 13 with its lens system movable along a path 14, which may extend in the X-direction or the Y-direction depending on the desired sweeping direction of the laser light beam. In FIGS. 3-5 the path 14 of the laser gun 13 is shown extending in the X-direction, that is parallel to the path 12 of the laser carriage 11.

According to the invention the laser gun 13 is arranged for exposing of only a minor portion of the light sensitive plate at the time, and the laser gun 13 therefore can be of small size and can be mounted relatively close to the exposure table 5 with the plate 6. As mentioned above this involves several advantages, of which it should be emphasized that there is a very little risk of relative movements between the laser gun 13 and the plate 6 on the exposure table 5, that the laser gun 13 and the lens system thereof can be made relatively cheap, that a good precision and accuracy is obtained for the laser dots on the light sensitive plate, and that there is a relatively little difference in focal distances at different parts of each exposure portion of the plate 6.

As one typical example FIG. 5 shows a printing plate 6 comprising thirtytwo print pages and in which plate four pages.are being exposed at the time. For the sake of clearness the laser gun 13 is shown exploded from the laser carriage 11. The light beam sweeping movement of the laser gun 13 is shown with the phantom lines 15. The parts 16 of the plate 6 marked with the hatched lines have already been exposed whereas the non-exposed portions of the plate are shown blank. Upon exposure of four pages at the time the laser carriage 11 adjusts itself in two alternative X-positions, one position of which is shown in FIG. 5, and in which the laser light beam during the exposure sweeps in an oscillating and successively in the X-direction extended movement from the far remote longitudinal edge 17 of the plate 6 and over four pictures or pages. In the illustrated position the laser beam has sweep-exposed two complete and two half pages in the adjusted position.

When the four actual pages have been exposed the laser carriage 11 moves to its second end positon in which the laser beam exposes the four additional pages in this X-row of pair of pages. Thereafter the exposure table moves a distance towards the discharge end corresponding to two rows of pages and the laser beam starts exposing the last series but one of four pages.

The laser unit is of a known type and is therefore not,to be described in detail. It comprises a laser gun having a lens system which is adjusted so that the focus of the laser light beam falls on the light senrive plate. The laser may be of various types, As an example of a suitable laser beam source can be mentioned argon-ion-laser. Of course other types of laser beam sources can be used. The laser gun is light sealed, for instance by means of a Venetian blind as indicated in FIGS. 1 and 2, so that the laser unit can be displaced without letting light into the chamber with the light sensitive plate.

The entire plant comprising the plate cassette 1, the plate loading lift 2, the laser unit 3 and the discharge conveyer 4 are formed light sealed, so that the plant can be used also in soft daylight. The discharge conveyer thereby is connected to a developing station which can be placed in any type of dark-room.

The described apparatus functions as follows:

In the starting position the exposure table is retracted from the plate loading lift 2, and said lift thereby can be lowered to collect and lift a light sensitive plate 6. The exposure table 5 now is moved to a position under the plate 6 hanging in the plate lift 2, whereupon the plate 6 is lowered and is secured, by means of its punch holes, on equivalent locating pins of the exposure table. The plate loading lift 2 is lifted, and the exposure table 5 with the plate fixed thereto is moved such a long distance in the X-direction under the laser unit 3 which corresponds to the number of longitudinal rows of pages to be exposed in the first stage. Concurrently therewith the laser unit 3 is moved in the Y-direction to a position for, exposing the number of cross rows of pages which are to be exposed, e.g. two or four pages out of a 8-, 16- or 32-page light sensitive plate.

In a particular embodiment of the invention the laser unit 3 can be lowered into contact with the light sensitive plate 6, and this is still more advantageous in that the risk of relative movements between the plate and the laser unit is thereby practically eliminated.

In the position now taken by the exposure table and by the laser unit the intended number of pages are exposed in that the laser gun 13, in a light beam sweeping movement 15, moves in the X-direction (alternatively in the Y-direction) over the four pages on its path 14 of movement.

After the said four pages have been exposed the laser unit 3 is raised from the plate 6 and the laser carriage 11 moves a predetermined distance in the X-direction to enter a position for exposing the next series of, for instance, four pages.

When now a row consisting of eight pages have been exposed the exposure table 5 moves a distance corresponding to two pages in the X-direction, whereafter the next sequence of exposure of 4+4 pages is started. Correspondingly the exposure table 5 and the laser unit 3 step forward until the full series of 8 exposures (8*4=32 pages) is completed, whereupon the exposure table 5 is moved to a position above the discharge conveyor 4, which receives the plate 6, as known per se, and forwards same to a means for development or any other supplementary handling.

I claim:

1. Method of exposing multiple page original images onto a light sensitive plate by means of laser light exposure comprising the steps of:

collecting the light sensitive plate from a plate cassette;

placing the light sensitive plate on a stepwise movable exposure table;

introducing said exposure table with the light sensitive plate under said laser unit;

lowering said laser unit to a cooperating and locking contact with the light sensitive plate before beginning each exposure stage of the plate by means of laser beam light;

exposing said light sensitive material in several successive steps, with less than all of the multiple pages of the light sensitive plate being exposed at a time, said exposing comprising executing three cooperating movements of the parts of an exposure plant, said three cooperating steps comprising stepwise displacing an exposure table in a first direction, stepwise displacing a laser unit in a second direction which is perpendicular to said first direction, and successive displacing a laser gun in said first or said second direction whereby said laser gun is sweep exposing the light sensitive plate while both said exposure table and said laser unit remain stationary; and discharging the exposed plate.

2. Method according to claim 1, further comprising collecting, simultaneous with said discharging, a new, nonexposed plate from said plate cassette.

3. Method according to claim 1, wherein said exposing step comprises exposing two or four pages at a time out of a plate comprising 16, 32 or 64 pages.

4. Apparatus for exposing multiple page original images onto a light sensitive plate comprising:

means for collecting the light sensitive plate from a plate cassette;

a laser unit for exposing the light sensitive plate, means for placing said laser unit into a cooperating and locking contact with the light sensitive plate, said laser unit being arranged to expose less than all of the multiple pages of the light sensitive plate at a time to a laser light beam;

a movable exposure table for moving the light sensitive plate through the apparatus;

means for displacing said exposure table with the light sensitive plate stepwise in a first direction through said laser unit;

means for displacing said laser unit in a second direction which is perpendicular to said first direction of the displacement of said exposure table; and a laser gun;

means for moving said laser gun, while sweep exposing the light sensitive plate, in one of said first and said second directions;

means for maintaining said exposure table and said laser unit in a fixed position while said laser gun is being moved; and means for moving the exposed plate to a developing unit.

5. Apparatus according to claim 4 wherein said exposure table is displaceable along a path on a base of the apparatus, and said laser unit is displaceable along a path on said base of the apparatus.

6. Apparatus according to claim 4, wherein said means for placing said laser unit comprises means for raising and lowering said laser unit.

7. Apparatus according to claim 4, further comprising an or controlling said means for collecting the light sensitive plate, said means for placing said laser unit, said means for displacing said exposure table, said means for displacing said laser unit, said means for moving said laser gun, said means for maintaining, and said means for moving the exposed plate so that the collection of a light sensitive plate, the stepwise exposure of the light sensitive plate and the transportation of the exposed plate is made fully automated in successively proceeding stages.

8. Apparatus according to claim 7, wherein said plate cassette contains sufficient light sensitive plates such that the apparatus can be operated fully automatically for a complete working period.

9. Apparatus according to claim 4, wherein 1/16th, ⅛th or ¼th of the light sensitive plate is exposed at a time by means of laser light exposure.

* * * * *